US009788417B2

(12) United States Patent
Hsieh et al.

(10) Patent No.: US 9,788,417 B2
(45) Date of Patent: Oct. 10, 2017

(54) THERMAL MANAGEMENT STRUCTURES FOR OPTOELECTRONIC MODULES

(71) Applicant: FINISAR CORPORATION, Sunnyvale, CA (US)

(72) Inventors: Cindy H. Hsieh, Los Altos, CA (US); Frank J. Flens, Campbell, CA (US); Ziv Lipkin, Cupertino, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 183 days.

(21) Appl. No.: 14/266,783

(22) Filed: Apr. 30, 2014

(65) Prior Publication Data
US 2015/0282303 A1 Oct. 1, 2015

Related U.S. Application Data

(60) Provisional application No. 61/817,784, filed on Apr. 30, 2013.

(51) Int. Cl.
H05K 1/02 (2006.01)
G02B 7/02 (2006.01)
(Continued)

(52) U.S. Cl.
CPC ......... H05K 1/0274 (2013.01); G02B 6/4202 (2013.01); G02B 6/428 (2013.01);
(Continued)

(58) Field of Classification Search
CPC .... H05K 1/0203; H05K 7/2039; G02B 7/028; G02B 6/4272; G02B 6/4266
See application file for complete search history.

(56) References Cited

U.S. PATENT DOCUMENTS

2009/0269006 A1 10/2009 Ishikawa et al.
2010/0303423 A1 12/2010 McColloch
(Continued)

FOREIGN PATENT DOCUMENTS

CN 102183829 A 9/2011
EP 2242152 A1 10/2010
EP 2270935 A1 1/2011

OTHER PUBLICATIONS

International Search Report and Written Opinion mailed Oct. 17, 2014 in related PCT application No. PCT/US2014/036268.

Primary Examiner — Thomas K Pham
Assistant Examiner — Cara Rakowski
(74) Attorney, Agent, or Firm — Maschoff Brennan

(57) ABSTRACT

An example embodiment includes optoelectronic module. The optoelectronic module may include a lens assembly, a module board, heat-generating components, and a thermally conductive plate. The lens assembly may be secured to the module board. The module board may include a printed circuit board (PCB). The heat-generating components may be mounted to the PCB. The thermally conductive plate may be secured to a surface of the module board. The thermally conductive plate may define an opening that receives at least a portion of the lens assembly. The thermally conductive plate may be configured to absorb at least a portion of thermal energy generated during operation of the heat-generating components and to transfer the thermal energy away from the heat-generating components.

15 Claims, 6 Drawing Sheets

(51) Int. Cl.
*H05K 7/20* (2006.01)
*G02B 6/42* (2006.01)

(52) U.S. Cl.
CPC ........... *G02B 6/4272* (2013.01); *G02B 7/023* (2013.01); *G02B 7/028* (2013.01); *H05K 1/0203* (2013.01); *H05K 7/2039* (2013.01); *H05K 2201/10121* (2013.01)

(56) References Cited

U.S. PATENT DOCUMENTS

2011/0026888 A1\* 2/2011 Nekado ................ G02B 6/4201
 385/92
2011/0207344 A1\* 8/2011 McColloch .......... G02B 6/3885
 439/78
2012/0288241 A1 11/2012 Rosenberg et al.

\* cited by examiner

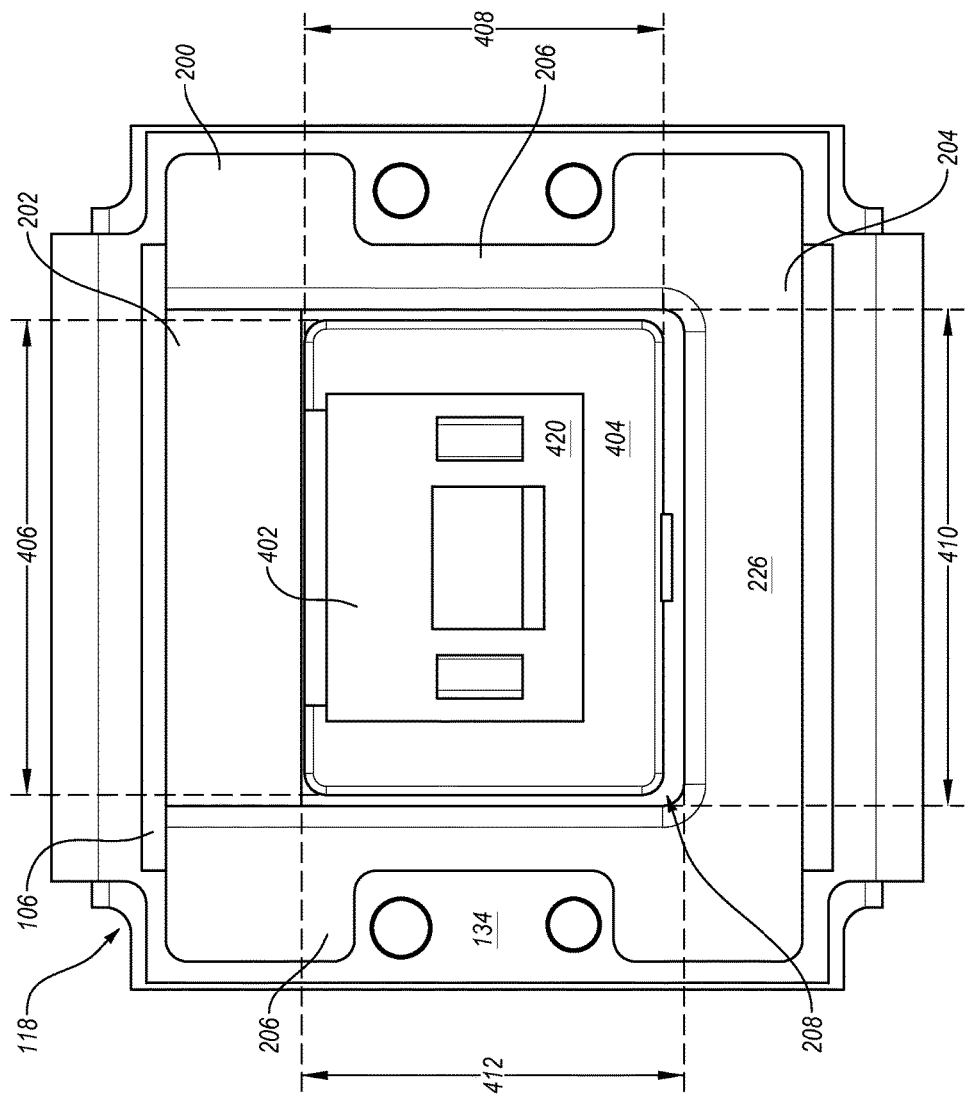

THERMAL MANAGEMENT STRUCTURES FOR OPTOELECTRONIC MODULES

CROSS-REFERENCE TO RELATED APPLICATIONS

This patent application claims the benefit of and priority to U.S. Provisional Patent Application No. 61/817,784 filed Apr. 30, 2013, which is incorporated herein by reference in its entirety.

FIELD

Embodiments disclosed herein relate to optical components. More particularly, some example embodiments relate to heat dissipation in optoelectronic modules.

BACKGROUND

Some data transmission involves the conversion of optical signals to electrical signals and/or electrical signals to optical signals. In some applications, the conversion occurs at a circuit board. For example, an optical fiber carrying one or more optical signals interfaces with a board-mounted optical engine. At the optical engine, the optical signals may be converted from optical signals to electrical signals using optical receivers. The electrical signals may then be communicated along etched copper traces integrated into the circuit board to a destination. Likewise, electrical signals may be communicated along copper traces to the optical engine. At the optical engine, the electrical signals may be converted to optical signals by optical transmitters. The optical signals may then be further communicated along the optical fiber.

The conversion of the data between optical and electrical domains generates heat. In some circumstances, the heat generated may cause problems with proper function of the components involved in conversion. Additionally, excess heat may shorten the life or cause failure of components involved in the transductions. Moreover, the heat may leak to surrounding components on the circuit board and cause similar problems.

The subject matter claimed herein is not limited to embodiments that solve any disadvantages or that operate only in environments such as those described above. Rather, this background is only provided to illustrate one exemplary technology area where some embodiments described herein may be practiced.

SUMMARY

An example embodiment includes an optoelectronic module. The optoelectronic module may include a lens assembly, a module board, heat-generating components, and a thermally conductive plate. The lens assembly may be secured to the module board. The module board may include a printed circuit board (PCB). The heat-generating components may be mounted to the PCB. The thermally conductive plate may be secured to a surface of the module board. The thermally conductive plate may define an opening that receives at least a portion of the lens assembly. The thermally conductive plate may be configured to absorb at least a portion of thermal energy generated during operation of the heat-generating components and to transfer the thermal energy away from the heat-generating components. The lens assembly may be secured to the module board or secured to both the module board and the thermally conductive plate.

An example embodiment includes a thermal energy dissipation system configured for use in an optoelectronic module. The system may include a cover and a thermally conductive plate. The cover may define a cavity. The cavity may be defined to substantially enclose a top surface of a module board and to at least partially surround a lens assembly secured to the module board and one or more heat-generating components mounted to the top surface of the module board. The thermally conductive plate may be positioned on the top surface of the module board. The thermally conductive plate may be configured to absorb thermal energy generated during operation of the one or more heat-generating components and to dissipate the thermal energy to the cavity and the cover.

Another embodiment may include a thermally conductive plate (plate). The thermally conductive plate may be configured to dissipate heat from one or more heat-dissipating components of an optoelectronic module. The thermally conductive plate may include a front portion, a rear portion opposite the front portion, two side portions, plate feet, and a bottom surface. The two side portions may connect the front portion to the rear portion. The plate feet may have a foot thickness that is greater than thicknesses of the front portion, the rear portion, and the two side portions. The plate feet may be configured to be secured to a module board such that the front portion, the rear portion, and the side portions are separate from a top surface of the module board. At least a portion of the bottom surface is configured to contact a heat-generating component mounted to the top surface of the module board. The front portion, the rear portion, and the two side portions may define an opening configured to receive at least a portion of a lens assembly.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which:

FIGS. 4A-4C illustrate an example arrangement of a lens assembly in relationship to the plate and the module board of FIGS. 2-3 that may be implemented in the optoelectronic module of FIG. 1.

DESCRIPTION OF SOME EXAMPLE EMBODIMENTS

Some embodiments described herein relate to heat dissipation in optoelectronic modules. In an example embodiment, an optoelectronic module includes a lens assembly, a module board, multiple heat-generating components, a cover, and a thermally conductive plate (plate). The heat-generating components include one or more clock and data recovery (CDR) chips mounted to a printed circuit board (PCB) included on the module board. The plate is configured such that the plate rests on the CDR chips to absorb thermal energy generated during operation of the CDR chips. Some of the thermal energy absorbed by the plate is dissipated throughout the optoelectronic module. In addition, the cover is configured to contact the plate. The contact between the plate and the cover enables further dissipation of the thermal energy through the cover.

The plate defines an opening configured to at least partially receive the lens assembly. The lens assembly may be received within the opening and adjusted to align or orient the lens assembly with respect to one or more of the heat-generating components. Additionally, the plate supports the lens assembly. Specifically, the lens assembly is bonded to the plate rather than to the PCB.

Reference will now be made to the drawings to describe various aspects of some additional embodiments. It is to be understood that the drawings are diagrammatic and schematic representations of the embodiments, and are not meant to be limiting, nor are they necessarily drawn to scale. Throughout the appended drawings, like numbers generally reference like structures unless described otherwise.

Figure 1:
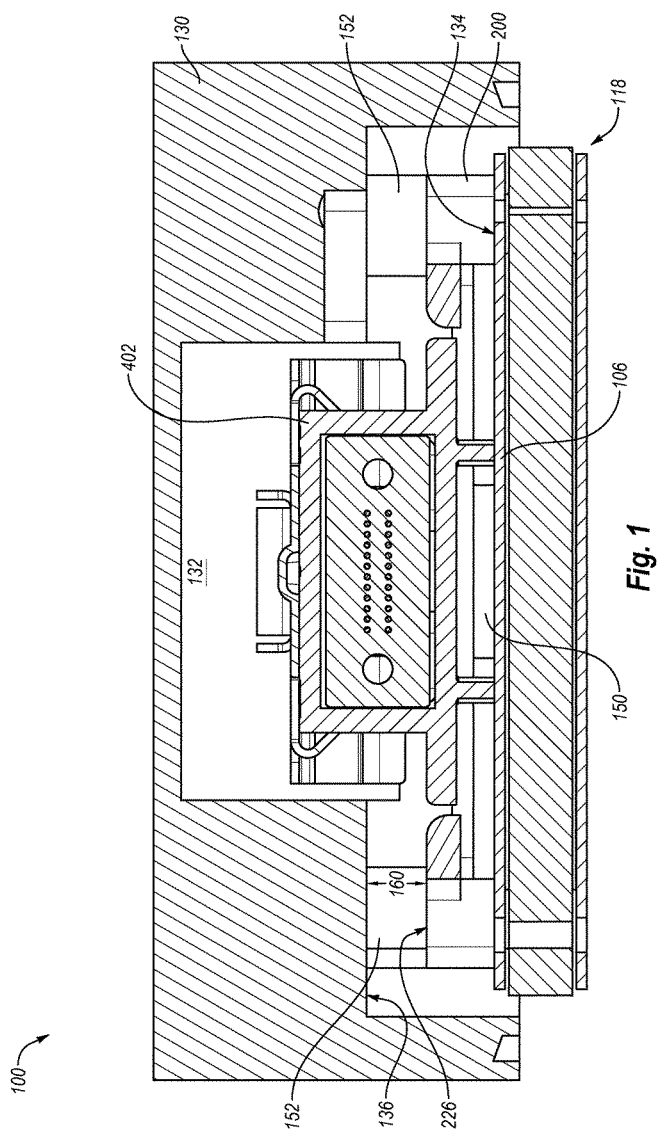
FIG. 1 illustrates an example optoelectronic module in which one or more embodiments described herein may be implemented.

FIG. 1 illustrates an example optoelectronic module 100 in which one or more embodiments described herein may be implemented. The optoelectronic module 100 illustrated in FIG. 1 is an optical engine, although the embodiments described herein are not limited to optical engines. In these and other embodiments, the optoelectronic module 100 may be designed for high-speed (e.g., 25 gigabits per second (G) or higher) optical interconnects between integrated circuits and/or between circuit boards.

FIG. 1 is a sectional view of the optoelectronic module 100. In the optoelectronic module 100, a lens assembly 402 and a plate 200 may be positioned within a cavity 132, which may be defined at least partially by a cover 130. The cavity 132 may be at least partially bordered or enclosed by a module board 118. In the depicted configuration, the cover 130 substantially surrounds the lens assembly 402 and substantially encloses a top surface 134 of the module board 118 and components (e.g., 402 and 200) position or arranged thereon. In this and other embodiments, the cover 130 may be removably secured to the module board 118 or another structure using one or more fasteners (not shown), for instance.

The optoelectronic module 100 may include one or more optical components, electronic components, and intra-component connections used in optical and/or electrical communication. The optical components, electronic components, and intra-component connections are collectively referred to herein as "heat-generating components" and are represented in FIG. 1 by component 150. The heat-generating components 150 may include, but are not limited to, a lens, a laser or another optical transmitter, a p region/ intrinsic region/n region (PIN) photodiode or another optical receiver, a CDR chip, a monitor photodiode, etc. One or more of the heat-generating components 150 may be mounted to a PCB 106 included in the module board 118. As used to describe the relationship between the heat-generating components and the PCB 106, the term "mounted" may include physically and/or electrically coupling the heat-generating components 150 to the PCB.

During operation of the heat-generating components 150, thermal energy may be generated. The thermal energy may have the potential to damage one or more of the heat-generating components 150 and/or cause fluctuations in operation of the heat-generating components 150 if the thermal energy is not properly controlled/mitigated. To dissipate some portion of the thermal energy and thereby reduce thermal damage and/or excessive operating fluctuations, the optoelectronic module 100 may include the plate 200. The plate 200 may be positioned with respect to the heat-generating components 150 such that the thermal energy generated during operation may be absorbed by the plate 200. The plate 200 may be configured such that the thermal energy absorbed from the heat-generating components may be dissipated.

In some embodiments, the plate 200 may dissipate the thermal energy to the cavity 132. The thermal energy may then be conducted to the cover 130 and dissipated to an exterior environment. In these and other embodiments, the plate 200 may be sized to optimize surface area and volume surrounding the plate 200 within the cavity 132. For example, a cover separation 160, which is defined between a lower surface 136 of the cover 130 and an upper surface 226 of the plate 200, may be optimized in these embodiments.

Alternatively or additionally, some portion of the cover 130 may contact some portion of the plate 200. For example, a portion of the lower surface 136 may contact a portion of the upper surface 226 of the plate 200. Accordingly, in these embodiments, the cover separation 160 may be essentially zero. The plate 200 may transfer a portion of the thermal energy absorbed from the heat-generating components 150 to the cover 130. The thermal energy may then be dissipated to the surrounding environment. In these and other embodiments, the plate 200 may also transfer a portion of the thermal energy to the cavity 132.

Alternatively or additionally, a thermal pad 152 may be positioned between a portion of the upper surface 226 of the plate 200 and a portion of the lower surface 136 of the cover 130. For example, the thermal pad 152 may fill a volume created by the cover separation. The thermal energy, or some portion thereof, may be transferred from the plate 200 to the thermal pad 152, and then transferred to the cover 130. The thermal energy may then be dissipated to the surrounding environment. The thermal pad 152 may be composed of a flexible and/or compressible material configured to accommodate for imperfections of the upper surface 226 and/or the lower surface 136. In these and other embodiments, the plate 200 may also transfer some of the thermal energy to the cavity 132 and/or there may be direct contact between the plate 200 and the cover 130.

The optoelectronic module 100 may include the lens assembly 402. The lens assembly 402 may be configured to receive an optical interface and communicate optical signals carried along the optical interface to one or more of the heat-generating components 150.

The optical interface that may be received by the lens assembly 402 may be configured to secure one or more optical fibers used in the communication of optical signals to and from the optoelectronic module 100. For example, the optical interface may include a pluggable, twenty-four optical channel connector configured to interface with the lens assembly 402 and to communicate twenty-four channels of optical data.

Figure 2:
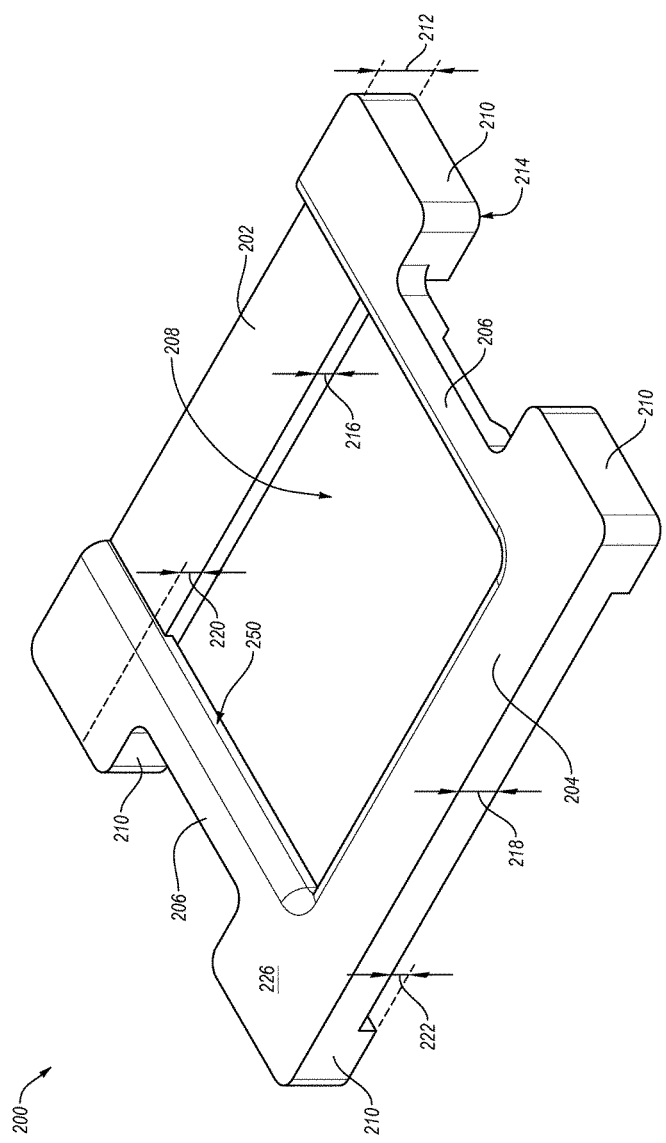
FIG. 2 illustrates an example embodiment of a thermally conductive plate (plate) that may be implemented in the optoelectronic module of FIG. 1.

FIG. 2 illustrates an example embodiment of the plate 200 that may be implemented in the optoelectronic module 100 of FIG. 1. The plate 200 may be configured to absorb thermal energy generated during operation of one or more heat-generating components and dissipate the thermal energy. The plate 200 may be composed of a thermally conductive material. For example, the plate 200 may be composed, at least partially, of copper. Alternatively or additionally, the plate 200 may be composed of gold, silver, other metals and/or metal alloys, other thermally conductive material(s), or a combination of materials. In some embodiments, the plate 200 may be a single piece or one or more portions (e.g., 202, 204, 208, or 210) may be manufactured independently and attached to the other portions. In these and other embodiments, the portions may be composed of the same or differing materials.

The plate 200 may include a front portion 202, a rear portion 204, and two side portions 206 that may connect the front portion 202 to the rear portion 204. In this and other embodiments, the front portion 202 may be designated as "front" due to a relationship between the plate 200 and a lens assembly when installed into an optoelectronic module. Front indicates the portion of the optoelectronic module (e.g., optoelectronic module 100 of FIG. 1) in which the optoelectronic module receives an optical interface. The rear portion 204 is generally opposite and parallel to the front portion and the side portions 206 run between the front portion 202 and the rear portion 204 and are generally perpendicular to the front portion 202 and the rear portion 204.

The front portion 202, the rear portion 204, and the two side portions 206 may define an opening 208. The opening 208 may be configured to receive a lens assembly such as the lens assembly 402 of FIG. 1 or some portion thereof (discussed below). A sidewall 250 may be defined as an interior surface of the plate 200 that defines and borders the opening 208. The sidewall 250 is generally a perimeter of the opening 208. The sidewall 250 may include curved portions and substantially flat portions.

The plate 200 may also include one or more plate feet 210. The plate feet 210 may be configured to secure the plate 200 to a module board such as the module board 118. The plate feet 210 may include a foot thickness 212 defined from the upper surface 226 to a bottom surface 214. Additionally, the front portion 202 may include a front thickness 216 and the rear portion 204 may include a rear thickness 218. The front thickness 216 may be defined from the upper surface 226 to a bottom surface 214 of the front portion 202. The rear thickness 218 may be defined between the upper surface 226 to the bottom surface 214 of the rear portion 204.

The foot thickness 212 may be greater than the front thickness 216 and the rear thickness 218. The foot thickness 212 may accordingly separate the front portion 202, the rear portion 204, and the side portions 206 from a module board when the plate 200 is secured to the module board. Lifting the front portion 202, the rear portion 204, and the side portions 206 may position the front portion 202, the rear portion 204, the side portions 206, or some combination thereof such that the bottom surface 214 of the respective portion 202, 204, or 206 contacts a heat-generating component (e.g., 150 of FIG. 1). Due to the bottom surface 214 contacting the heat-generating component, thermal energy may be transferred from the heat-generating component to the plate 200.

For example, a difference 222 between the rear thickness 218 and the foot thickness 212 may be about equal to a height of a heat-generating component. Thus, the plate 200 may be positioned such that the bottom surface 214 of the rear portion 204 contacts the heat-generating component. Thermal energy may accordingly be transferred directly, e.g., via thermal conduction, from the heat-generating component to the rear portion 204.

Additionally in some embodiments, the front thickness 216 may differ from the rear thickness 218, which may create a clearance 220. The clearance 220 may enable introduction of an optical interface (not shown) to a lens assembly received in the opening 208.

Figure 3:
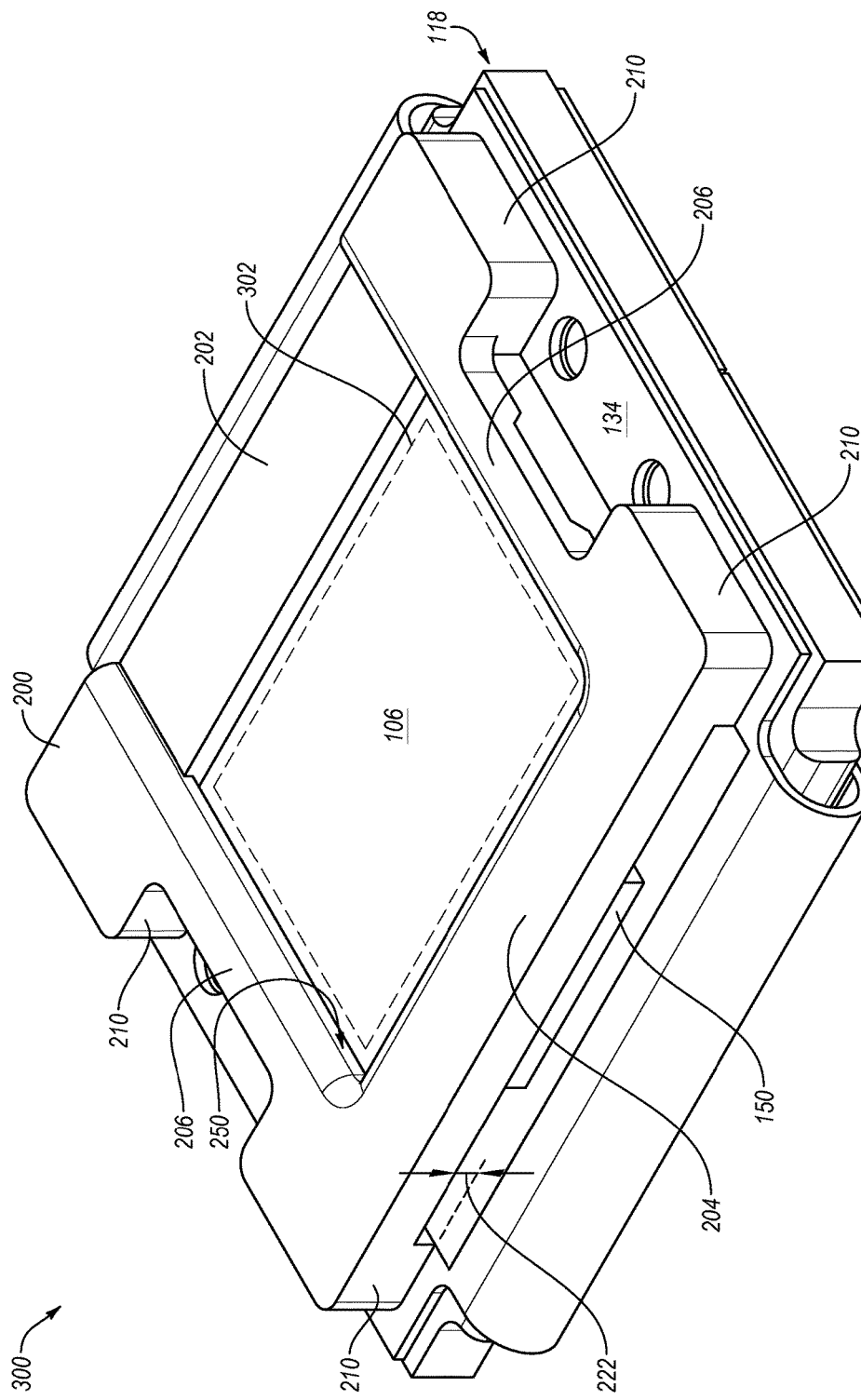
FIG. 3 illustrates an example arrangement of the plate of FIG. 2 with respect to a module board that may be implemented in the optoelectronic module of FIG. 1.

FIG. 3 illustrates an example arrangement 300 of the plate 200 of FIG. 2 with respect to the module board 118 that may be implemented in the optoelectronic module 100 of FIG. 1. In FIG. 3, the plate 200 described with reference to FIG. 2 is depicted secured to the module board 118 of FIG. 1. Accordingly, some components and features (e.g., 106, 134, 150, 208, 210, 222, and 250) already described with reference to FIGS. 1 and 2 are included in FIG. 3. Some details of these components and features are not repeated with reference to FIG. 3.

The arrangement 300 generally includes the plate 200 being secured to the top surface 134 of the module board 118 via the plate feet 210. The module board 118 includes the PCB 106. The PCB 106 may include a central portion of the top surface 134. One or more heat-generating components 150 may be mounted to the PCB 106.

In this and other embodiments, each of the plate feet 210 may be positioned within an area of the top surface 134, which is outside the PCB 106. By positioning the plate feet 210 outside the PCB 106, the plate 200 may be electrically isolated from the heat-generating components 150 mounted to the PCB 106.

Additionally, the plate 200 may be positioned on the module board 118 with respect to one or more of the heat-generating components 150. For example, the front portion 202, the rear portion 204, the side portions 206, or some combination thereof may be positioned such that the bottom surface 214 of the respective portion 202, 204, and/or 206 contacts one or more of the heat-generating components 150. Specifically, the difference 222 may enable the heat-generating component 150 to be positioned directly below the rear portion 204 and may further enable the rear portion 204 to contact a top surface of the heat-generating component 150.

Additionally, the opening 208 defined by the plate 200 may be positioned over a middle portion of the PCB 106. The middle portion is represented in FIG. 3 by a boxed area with a dashed border 302. The heat-generating components (not shown) mounted to the middle portion 302 of the PCB 106 may be involved in the communication of optical data, for instance.

Figure 4A:
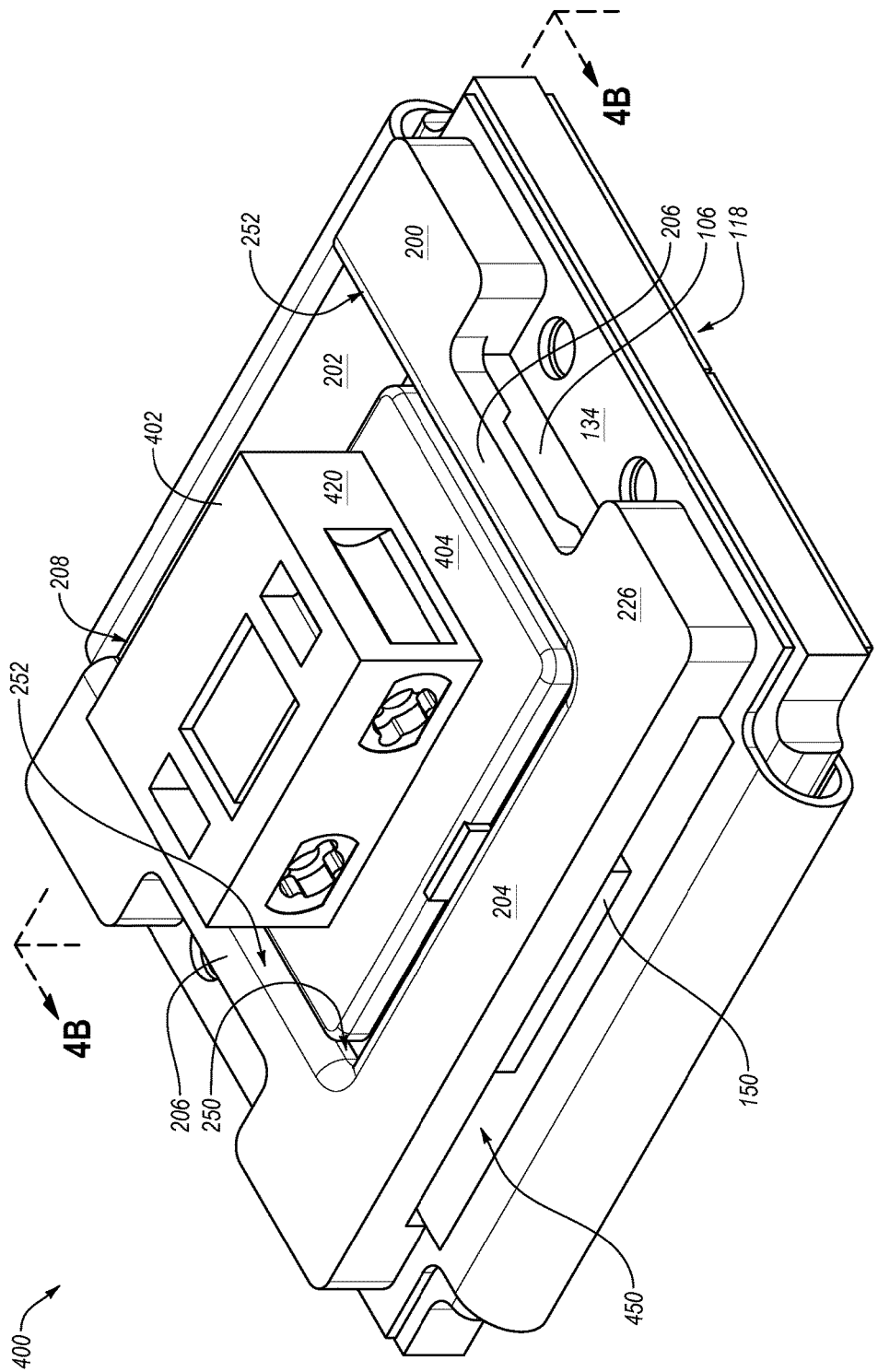
Figure 4B:
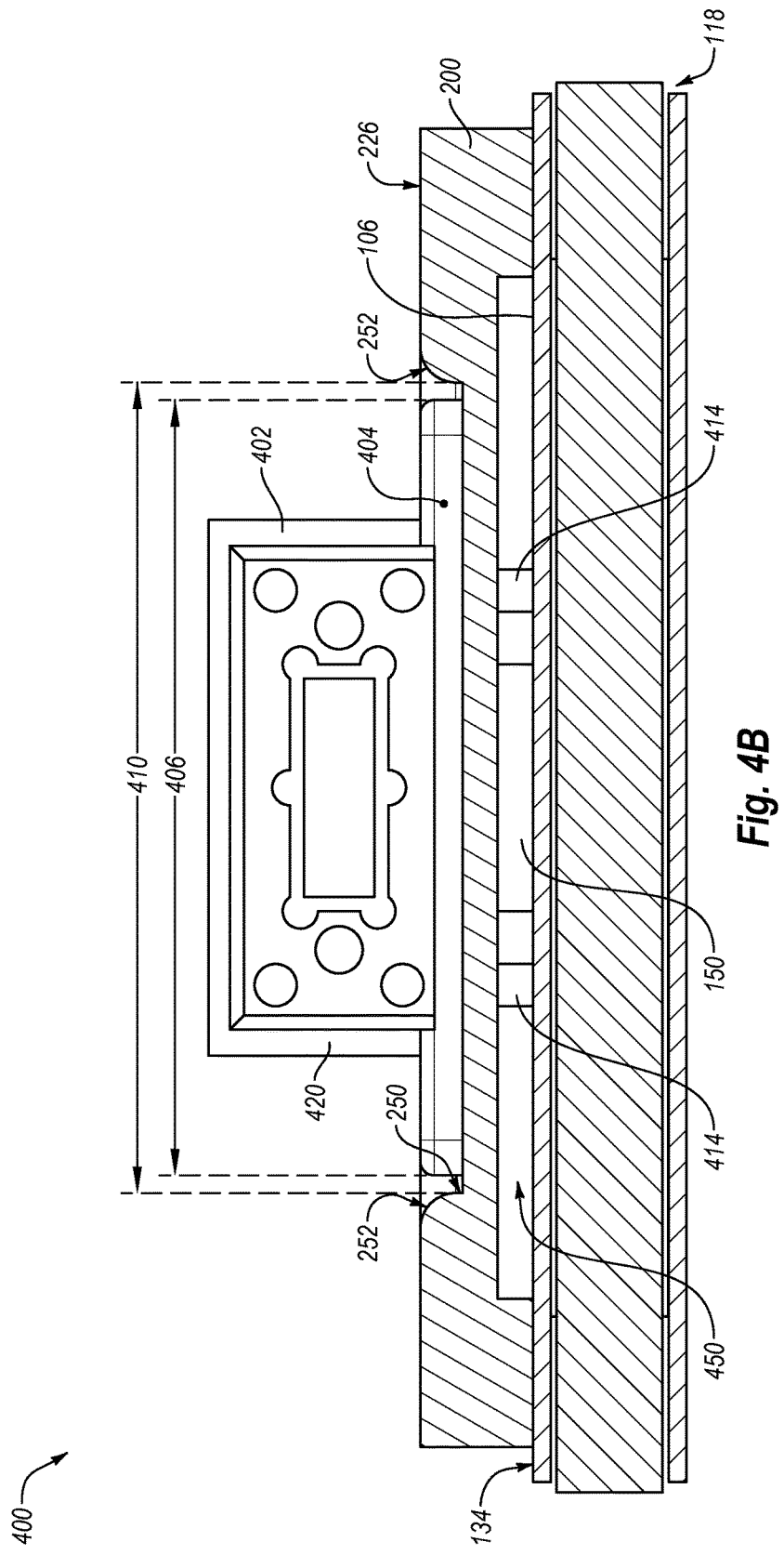

FIGS. 4A-4C illustrate an example arrangement 400 of the lens assembly 402 in relationship to the plate 200 and the module board 118 of FIGS. 2-3 that may be implemented in the optoelectronic module 100 of FIG. 1. Specifically, FIG. 4A depicts a perspective view of the arrangement 400. FIG. 4B depicts a sectional view of the arrangement 400. FIG. 4C depicts a top view of the arrangement 400. In some embodiments, FIGS. 4A-4C may substantially depict the optoelectronic module 100 of FIG. 1 with the cover 130 removed. The arrangement 400 of FIGS. 4A-4C includes components and features (e.g., 106, 134, 150, 200, 202, 204, 206, 208, and 250) already described with reference to FIGS. 1-3. Some details of the components and features are not repeated with reference to FIGS. 4A-4C.

As discussed with reference to FIG. 3, the plate 200 may be secured to the top surface 134 of the module board 118. For example, the plate 200 may be secured to the outside portion of the top surface 134 that includes the PCB 106. The plate 200 may further be arranged such that one or more of the front portion 202, the rear portion 204, and the side portions 206 contact a heat-generating component 150 mounted to the PCB 106. The opening 208 defined by the plate 200 may be positioned over a middle portion (302 of FIG. 3) of the PCB 106 such that one or more heat-generating components mounted to the middle portion of the PCB 106 are not covered by the plate 200.

The lens assembly 402 may be positioned with respect to the opening 208. The positioning of the lens assembly 402 may enable communication of data between the heat-generating components in the middle portion of the PCB through the lens assembly 402 and to an optical interface (not shown) received in the lens assembly 402.

In the depicted embodiment, the lens assembly 402 or some portion thereof may be received within the opening 208 defined in the plate 200. Specifically, the lens assembly 402 may include a lens base 404. The lens base 404 may include a portion of the lens assembly 402 that structurally supports a receiving portion 420 of the lens assembly 402.

The lens base 404 may include a base length 406 (FIGS. 4B and 4C only) and a base width 408 (FIG. 4C only). The base length 406 and the base width 408 may be less than an opening length 410 (FIGS. 4B and 4C only) and an opening width 412 (FIG. 4C only), respectively. In these and other embodiments, a difference between the base length 406 and the opening length 410 and/or a difference between the base width 408 and the opening length 410 may enable adjustment of the lens assembly 402 with respect to the plate 200 and/or the PCB 106. An adjustment of the lens assembly 402 may further enable alignment of the lens assembly 402 with respect to one or more heat-generating components mounted to the middle portion of the PCB 106.

Additionally, in this and other embodiments, the lens assembly 402 may include one or more lens supports 414 (FIG. 4B only). The lens supports 414 may extend from the lens base 404 to be secured to the PCB 106 and/or the module board 118. Inclusion of the lens supports 414 may enable a reduction in an area on the PCB 106 occupied by the lens assembly 402 when compared to embodiments without the lens supports 414. For example, in embodiments without lens supports 414, the lens assembly 402 may be secured the PCB 106. An area occupied by the lens assembly 402 may be about equal to an area of a bottom surface of the lens base 404. However, with the lens supports 414, the lens assembly 402 may only occupy an area on the PCB 106 about equal to a sum of areas of bottom surfaces of the lens supports 414.

Additionally, as best illustrated in FIG. 4B, the lens supports 414 may elevate the lens assembly 402. A volume 450 between lens assembly 402 and the PCB 106 may enable circulation, thus dissipating of some thermal energy. For instance, the circulation may dissipate thermal energy generated by operation of one or more heat-generating components mounted to the PCB 106.

Additionally, by elevating the lens assembly 402, the "real estate" of the PCB 106 below the lens assembly 402 available for components may increase. An increase in the real estate below the lens assembly 402 may further enable positioning of a larger variety of components below the lens assembly 402. For example, in some optoelectronic modules the lens assembly 402 may define the area on the PCB 106 in which optical components are positioned. For instance, optical drivers and receivers may be positioned on a portion of a PCB 106 within the lens assembly 402. However, by elevating the lens assembly 402 there may be additional space where other components may be positioned.

In some embodiments, the lens base 404 may be configured such that the lens assembly 402 may be secured to the sidewall 250 (FIGS. 4A and 4B only) of the opening 208. In these and other embodiments, the base length 406 may be about equal to the opening length 410 and/or the base width 408 may be about equal to the opening width 412. In these and other embodiments, rather than the lens base 404 being entirely received into the opening 208, the lens assembly 402 may be secured to the sidewall 250 of the opening 208.

Additionally, in some embodiments in which the lens assembly 402 is secured to the sidewall 250 of the opening 208, the lens base 404 may be affixed, bonded, or epoxied to the sidewall 250. For instance, the lens assembly 402 may be affixed around a perimeter of the lens base 404. Affixing the lens assembly 402 to the sidewall 250 may seal the opening 208 defined by the plate 200. By sealing the opening 208, one or more of the heat-generating components 150 may be protected. Additionally or alternatively, emission of electromagnetic radiation (EMR) generated by the heat-generating components 150 may be reduced. For example, the EMR may be substantially prevented from escaping through the opening 208 and may accordingly be sealed within a volume between the plate 200 and the top surface 134 of the module board 118. Additionally, in embodiments in which the lens assembly 402 is secured to the sidewall 250 of the opening 208, the lens assembly 402 may include one or more lens supports 414, which may function and provide one or more benefits as described above.

Additionally, in some embodiments in which the lens assembly 402 is secured to the sidewall 250 of the opening 208, the lens base 404 may be secured (e.g., affixed, bonded, or epoxied) to the sidewall 250 along some portion of the sidewall 250. The portion of the sidewall 250 along which the lens base 404 is secured may be optimized to reduce thermal stresses induced on the lens assembly 400. In some embodiments, the portion along which the lens base 404 is secured to the plate 200 may be minimized such that the lens assembly 400 is held in a particular position with respect to one or more of the heat-generating components 150 and such that the thermal stresses imposed on the lens assembly 400 by the plate 200 may be minimized. For example, the rear portion 204 of the plate 200 may contact the heat-generating components 150. According, the lens base 404 may be secured to the sidewall 250 along side portions 252 (FIG. 4A only) of the sidewall 250. By securing the lens base 404 along the side portions 252, the lens assembly 400 may be held in a particular position while leaving some space between the lens base 404 and rear portion 204 of the plate 200, which may reduce thermal stresses imposed on the lens assembly 400. In other embodiments, the lens base 404 may be secured along another section and/or one or more other sections of the sidewall 250. For example, the lens base 404 may be secured at one or more corners of the opening 208, along one of the side portions 252, a section of one of the side portions 252, along a section of the lens base 404 near the rear portion 204, the side portions 206 or the front portions, or any combination thereof.

The present invention may be embodied in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optoelectronic module comprising:
    a lens assembly;
    a module board including a printed circuit board (PCB) on a central portion of a top surface of the module board, wherein the lens assembly is secured to the top surface of the module board;
    heat-generating components mounted to the PCB;

a thermally conductive plate; and
a cover positioned on the module board such that the cover encloses a top surface of the module board, wherein:
the cover defines a cavity into which the lens assembly, the heat-generating component, and the thermally conductive plate are positioned,
the module board borders the cavity such that the cover and the module board surround the lens assembly and the thermally conductive plate, and enclose the heat-generating components,
the thermally conductive plate defines an opening in which at least a portion of the lens assembly is positioned,
the thermally conductive plate includes a rear portion, a front portion, two plate feet coupled to the front portion, and two plate feet coupled to the rear portion,
the rear portion includes a bottom surface and a rear thickness,
the plate feet include a foot thickness that is greater than the rear thickness of the rear portion,
the front portion is opposite the rear portion and includes a front thickness that is less than the foot thickness,
the front thickness is sized to provide clearance for introduction of an optical interface to the lens assembly,
the plate feet are secured directly to the top surface of the module board such that the rear portion and the front portion are separated from the top surface of the module board,
at least one of the heat-generating components is positioned between the bottom surface of the rear portion and the PCB, and
the rear thickness of the rear portion is configured such that the bottom surface of the rear portion of the thermally conductive plate directly physically contacts the at least one of the heat-generating components to absorb at least a portion of thermal energy generated during operation of the at least one of the heat-generating components.

2. The optoelectronic module of claim 1, wherein the opening is configured to receive a lens base of the lens assembly and to allow for positional adjustment of the lens assembly with respect to at least one of the heat-generating components.

3. The optoelectronic module of claim 2, wherein the lens assembly is further secured to a portion of a sidewall of the thermally conductive plate that defines a perimeter of the opening.

4. The optoelectronic module of claim 1, wherein the lens assembly includes:
a lens base that is secured to at least a portion of a sidewall of the opening; and
one or more lens supports that extend from the lens base and contact the PCB.

5. The optoelectronic module of claim 4, wherein the lens base is secured to the thermally conductive plate along the sidewall to reduce electromagnetic radiation emission from the heat-generating components.

6. The optoelectronic module of claim 1, wherein the cover contacts at least a portion of the thermally conductive plate to receive at least some of the thermal energy from the thermally conductive plate.

7. The optoelectronic module of claim 1, further comprising:
a cover including a lower surface that is separated from an upper surface of the thermally conductive plate by a cover separation; and
a thermal pad positioned in between the lower surface and the upper surface that is configured to accommodate imperfections of the upper surface or the lower surface.

8. The optoelectronic module of claim 1, wherein the heat-generating components include one or more clock and data recovery (CDR) chips.

9. The optoelectronic module of claim 1, wherein the thermally conductive plate is comprised of copper.

10. The optoelectronic module of claim 1, wherein:
the thermally conductive plate further includes two side portions that are each coupled to two of the plate feet.

11. The optoelectronic module of claim 1, wherein:
the thermally conductive plate includes two side portions; and
the plate feet are configured to directly contact a top surface of the module board such that the side portions are separated from the top surface of the module board.

12. The optoelectronic module of claim 1, wherein the cover includes a lower surface configured to be positioned above a portion of an upper surface of the thermally conductive plate, and the optoelectronic module further comprises a thermal pad positioned in between the lower surface and the upper surface that is configured to accommodate imperfections of the upper surface or the lower surface.

13. The optoelectronic module of claim 1, wherein:
the thermally conductive plate includes two side portions connecting the front portion to the rear portion, and the front portion, the rear portion, and the two side portions define the opening configured to receive at least a portion of the lens assembly.

14. The optoelectronic module of claim 1, wherein the rear portion includes a portion of a sidewall that defines at least a portion of a perimeter of the opening.

15. The optoelectronic module of claim 1, wherein the cover includes a lower surface that physically contacts an upper surface of two side portions of the thermally conductive plate such that thermal energy may be transferred from the thermally conductive plate to the cover via thermal conduction.

* * * * *